(12) United States Patent
Vezier et al.

(10) Patent No.: US 11,954,015 B2
(45) Date of Patent: *Apr. 9, 2024

(54) SOFTWARE ENVIRONMENT FOR CONTROL ENGINE DEBUG, TEST, CALIBRATION AND TUNING

(71) Applicant: Silicon Mobility SAS, Valbonne (FR)

(72) Inventors: Loïc Vezier, La roquette sur Siagne (FR); Sylvain Rodhain, Maison-Alfort (FR)

(73) Assignee: SILICON MOBILITY SAS, Valbonne (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/840,847

(22) Filed: Jun. 15, 2022

(65) Prior Publication Data
US 2022/0391306 A1 Dec. 8, 2022

Related U.S. Application Data

(63) Continuation of application No. 16/760,196, filed as application No. PCT/EP2018/079835 on Oct. 31, 2018, now Pat. No. 11,397,663.
(Continued)

(30) Foreign Application Priority Data

Nov. 2, 2017 (EP) .................................. 17199622

(51) Int. Cl.
*G06F 11/36* (2006.01)
(52) U.S. Cl.
CPC ............................. *G06F 11/3664* (2013.01)

(58) Field of Classification Search
CPC ....... G06F 11/3664; G06F 30/30; G06F 30/33
See application file for complete search history.

(56) References Cited

U.S. PATENT DOCUMENTS

| 6,742,175 B1 | 5/2004 | Brassard |
| 7,069,526 B2 | 6/2006 | Schubert et al. |

(Continued)

FOREIGN PATENT DOCUMENTS

| CN | 108885545 B | * | 2/2022 | .......... G06F 11/3664 |

OTHER PUBLICATIONS

Couto et al., "Detecting Anomalous Energy Consumption in Android Applications", 2014, GreenSSCM (Year: 2014).*

(Continued)

*Primary Examiner* — Wei Y Zhen
*Assistant Examiner* — Junchun Wu
(74) *Attorney, Agent, or Firm* — Dinsmore & Shohl LLP

(57) ABSTRACT

The disclosure relates to the field of electric engine digital control domain such as used in the control of vehicle electric motors, including methods related to code handling in the context of debug and/or test and/or calibration or tuning target hardware systems. A method for automated generating of codes, for execution on a heterogeneous hardware system, including software and hardware programmable units, said codes include executable calibration instructions, comprises: (i) loading of initial code, including one or more code descriptions, (ii) providing user calibration instructions, specifying variables in the code descriptions to be considered as calibration parameters and/or monitored values, on said initial code; (iii) a step of automatically generating of said codes, at least one per available unit, based on said loaded initial code, provided with calibration instructions.

18 Claims, 14 Drawing Sheets

Related U.S. Application Data

(60) Provisional application No. 62/580,830, filed on Nov. 2, 2017.

(56) References Cited

U.S. PATENT DOCUMENTS

| | | | |
|---|---|---|---|
| 7,086,017 B1* | 8/2006 | Bloom | G06F 30/33 717/127 |
| 7,222,315 B2* | 5/2007 | Schubert | G06F 30/33 716/106 |
| 7,240,303 B1* | 7/2007 | Schubert | G06F 30/33 703/15 |
| 7,409,652 B1 | 8/2008 | Fox et al. | |
| 9,043,770 B2* | 5/2015 | Aliseychik | G06F 11/3664 717/149 |
| 9,354,998 B2 | 5/2016 | Hyland et al. | |
| 9,760,668 B2* | 9/2017 | Harper | G06F 30/3323 |
| 11,397,663 B2* | 7/2022 | Vezier | G06F 11/3664 |
| 2002/0072893 A1* | 6/2002 | Wilson | G06F 13/1605 714/E11.207 |
| 2002/0104060 A1* | 8/2002 | Abe | G06F 30/30 716/102 |
| 2003/0056197 A1* | 3/2003 | Dennis | G06F 11/3624 717/126 |
| 2003/0131325 A1* | 7/2003 | Schubert | G06F 30/3308 716/106 |
| 2003/0221185 A1* | 11/2003 | Bates | G06F 11/3664 717/125 |
| 2004/0015887 A1* | 1/2004 | Kudo | G06F 30/33 703/22 |
| 2004/0103336 A1* | 5/2004 | Flores | G06F 9/321 713/401 |
| 2007/0250819 A1* | 10/2007 | Fjeldstad | G06F 11/3664 717/124 |
| 2009/0113088 A1* | 4/2009 | Illowsky | G06F 11/2082 710/62 |
| 2011/0022817 A1* | 1/2011 | Gaster | G06F 9/5044 711/202 |
| 2013/0117730 A1* | 5/2013 | Wisniewski | G06F 11/362 717/125 |
| 2013/0125093 A1 | 5/2013 | Mandava et al. | |
| 2014/0019942 A1* | 1/2014 | Suevern | G06F 11/3644 717/124 |
| 2014/0137082 A1* | 5/2014 | Ellis | G06F 30/343 717/124 |
| 2014/0201721 A1* | 7/2014 | Bharadwaj | G06F 11/3664 717/131 |
| 2015/0121346 A1* | 4/2015 | Patel | G06F 30/30 717/125 |
| 2019/0065351 A1* | 2/2019 | Rakhmilevich | G06F 11/3684 |
| 2019/0146783 A1 | 5/2019 | Ginchereau et al. | |

OTHER PUBLICATIONS

Augonnet et al., "Automatic Calibration of Performance Models on Heterogeneous Multicore Architectures", 2010, Springer-Verlag Berlin Heidelberg (Year: 2010).*

Nane et al., "A Survey and Evaluation of FPGA High-Level Synthesis Tools", 2015, IEEE (Year: 2015).*

Siwakoti et al., "Design of FPGA-Controlled Power Electronics and Drives Using MATLAB Simulink", 2013, IEEE (Year: 2013).*

Peterson et al., "Assertion-Based On-Line Verification and Debug Environment for Complex Hardware Systems", 2004, IEEE (Year: 2004).*

Erkkinen, T.; "Automatic Flight Code Generation With Integrated Static and Run-Time Error checking and Code Analysis"; AIAA Modeling and Simulation Technologies Conference, Aug. 21, 2006; pp. 1-9.

Extended European Search Report dated May 8, 2018 in related European Application No. 17199622.6.

International Search Report and Written Opinion dated Nov. 29, 2018 in related International Application No. PCT/EP2018/079835.

International Preliminary Report on Patentability dated Jan. 1, 2020 in related International Application No. PCT/EP2018/079835.

* cited by examiner

SOFTWARE ENVIRONMENT FOR CONTROL ENGINE DEBUG, TEST, CALIBRATION AND TUNING

CROSS REFERENCE TO RELATED APPLICATIONS

The present disclosure is a continuation of U.S. application Ser. No. 16/760,196, filed on Apr. 29, 2020, which is a national stage entry of and claims priority to International App. No. PCT/EP2018/079835, filed Oct. 31, 2018, and entitled "SOFTWARE ENVIRONMENT FOR CONTROL ENGINE DEBUG, TEST, CALIBRATION AND TUNING," which claims priority to EP App. No. 17199622.6 and U.S. Provisional App. No. 62/580,830, each filed Nov. 2, 2017, the entireties of which are incorporated by reference herein.

TECHNICAL FIELD

The disclosure relates to the field of electric engine digital control domain, in particular targeting (but not limited to) control of pure electric or hybrid vehicle electric motors.

The disclosure relates to methods related to code handling in the context of debug and/or test and/or calibration or tuning for the above domain and a variety of uses enabled by said methods and/or related codes, particular target hardware systems, use and arrangements thereof and software environments, platforms supporting or using said methods.

BACKGROUND

The commonly used methodology for developing a motor control system is the following:
1. Step #1: Model in the loop algorithm development
    In this phase a model of the control and a model of the system (motor, powertrain, . . . ) are developed and debugged in a pure virtual manner (using Matlab/Simulink kind of simulation software)
    At this stage, all theoretical (assumed ideal) control curves are computed and validated.
    The model developed in this phase is considered as "golden" reference
2. Step #2: Control algorithm mapping onto ECU
    In this phase the ideal control algorithm from step #1 is translated into operational algorithm that fit into the selected engine control unit hardware.
    This phase can be more or less automated (especially in the case where the ECU is a pure software implementation). However, manual engineering is usually necessary in the case where:
        i. Part of the control is split from main control to be mapped in an external FPGA device (this is to handle fast real-time operations)
        ii. Part of the control algorithm is mapped on microcontroller target specific hardware accelerators (such as mathematical operators)
    In any case, the mapping phase leads to compromises in the control algorithm accuracy to work around hardware limitations.
3. Step #3: Hardware in the loop algorithm tuning
    This operation normally takes place in a laboratory test bench where the electric motor is put under accurately controlled operating conditions.
    In this phase, calibration infrastructure is added to the control algorithm to be able inject tuning parameters and gather operating variables curves
    Those curves are compared to ideal ones and feedback loop on parameters values is executed to reach optimal values.
    This operation applies on a quite large number of tuning parameters.
    This operation can also lead to feedback to step #1 to revisit ideal model as needed.
    At the end of this phase, the control algorithm is considered final, and a reduced set of tuning parameters are defined for use in step #4
4. Step #4: Vehicle in the loop algorithm tuning
    This operation takes place in the real vehicle on real life operating conditions
    The calibration mechanism is the same as step #3 except that the number of tuning parameters is reduced. it i Preferably the development flow is highly automated. This means that from control algorithm model to operational code running on ECU, there is basically no manual coding involved.
    This principle provides lots of benefits including:
    Risk of implementation errors is minimal (no manual re-coding)
    All the ECU target hardware limitations are taken into account in the early phases of the algorithm development. This means that all the appropriate compromises in algorithm accuracy are decided at Step #1 instead of Step #2.

As introduced above, the calibration task implies that some extra computing functions are added to the initial control algorithm in order to inject calibration value to some pre-defined parameters of the algorithm, and extract the values of some keys variables.

Thus, the calibration infrastructure is, by definition, intrusive with regard to the control algorithm.

Intrusiveness can be considered from two angles:
In the operational code, the calibration infrastructure must be there. There is no way we can escape this.
In the development phase, the question is to define at which step this calibration phase appears in the flow.
    Either this infrastructure is defined during Step #1.
        This is a problem because we add "non-functional" operations in the "golden" model. Therefore we cannot consider this model as golden any more.
    Or, the infrastructure is added as manual override over the generated code in Step #2.
        This is a problem because we break the model-based automated flow.

Method for automated generating code from initial code exist (such as U.S. Pat. No. 6,742,175 and/or "Automatic flight code generation with integrated static and run-time error checking and code analysis, XP 007905828) but none of them target nor deal with the specifics of a heterogeneous hardware system, comprising at least one software programmable unit and at least one hardware programmable unit, requiring a step of automatically generating codes, at least one per available unit.

Method for automated generating code from initial code exist but none of them target nor deal with the specifics of code handling in the context of debug and/or test, especially for the target platform mentioned above requiring said codes being provided with debug and/or test instructions.

Aim

It is the aim of the disclosure to have a calibration infrastructure, addressing the above mentioned problems, by making it suitable to include in operational code with (preferably absolutely) no modification of golden model and/or no manual overrides of generated code.

SUMMARY

In a first aspect of the disclosure, the disclosure relates to a method for automated generating of a plurality codes, suited for execution on a heterogeneous hardware system, comprising at least one software programmable unit and at least one hardware programmable unit, said codes include calibration instructions, said method comprising: (i) loading of initial (high-level simulation) code, including one or more code descriptions, (ii) loading calibration instructions; (iii) automatically generating of said codes (40), at least one per available unit, based on said loaded initial code and said loaded calibration instructions.

In a second aspect of the disclosure, the disclosure relates to an arrangement (part of or suitable 20 to be part of a driving vehicle) comprising an electric engine; and an engine control unit hardware, providing (real-time) control for said engine, said engine control unit hardware comprising a heterogeneous hardware system comprising at least one software programmable unit and at least one hardware programmable unit and are executing the codes are generated by the methods of the first aspect of the disclosure.

In a third aspect of the disclosure, the disclosure relates to further methods enabled by the methods and/or arrangements of the previous aspect, in particular methods for controlling the functional similarity of codes, comprising: (i) executing (simulating) initial (high-level simulation) code, including one or more code descriptions, (ii) executing the code as generated from said initial (high-level simulation) code by the methods of the first aspect of the invention; and (iii) compare the outcomes of said executions to verify the (substantially) functional similarity of said codes, and e.g. use those (comparisons e.g. the difference) to steer the calibration process.

In a fourth aspect of the disclosure, the disclosure relates to the related computer program product comprising computer-readable code, that when run on a computer system causes the computer system to execute the methods of any of the previous method claims.

In a fifth aspect of the disclosure, the disclosure relates to the related non-transitory machine-readable storage medium storing the computer program products described above.

DETAILED DESCRIPTION

Figure 1:
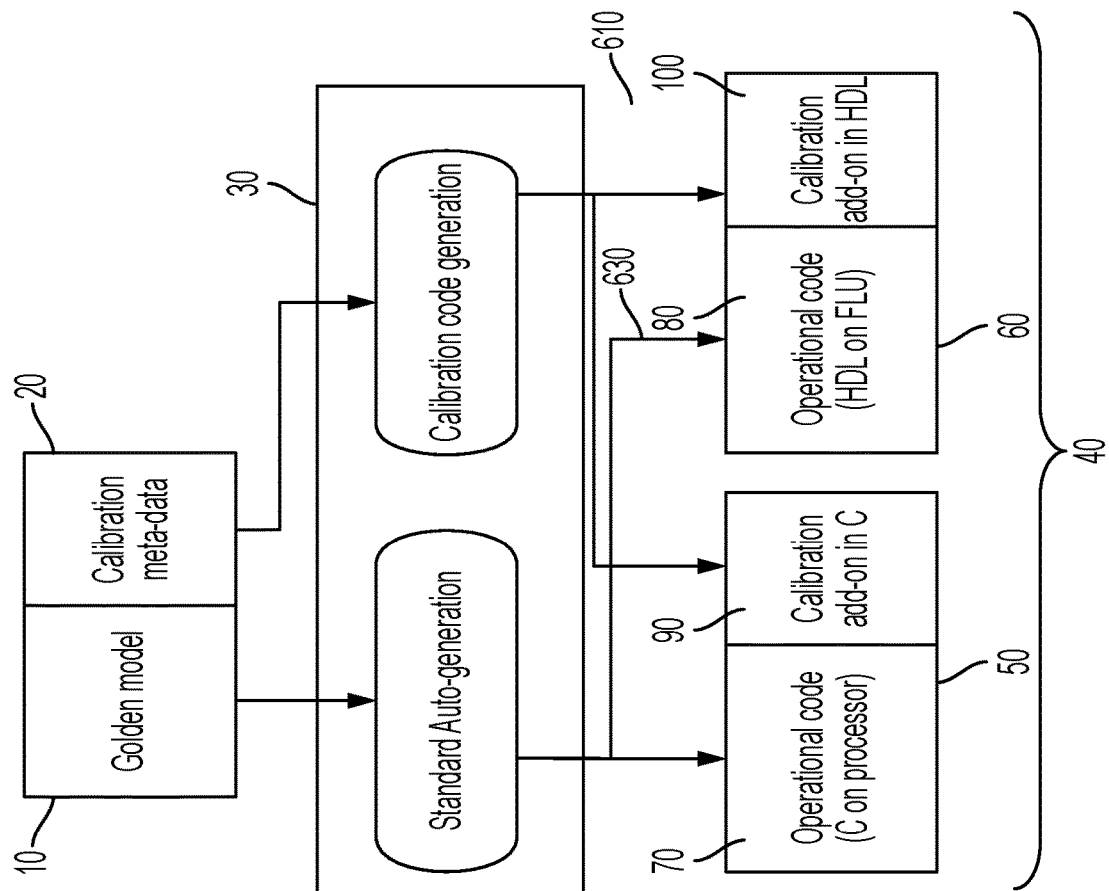
FIG. 1 described the context of the disclosure (left side) and the calibration challenge its supports.
Figure 1:
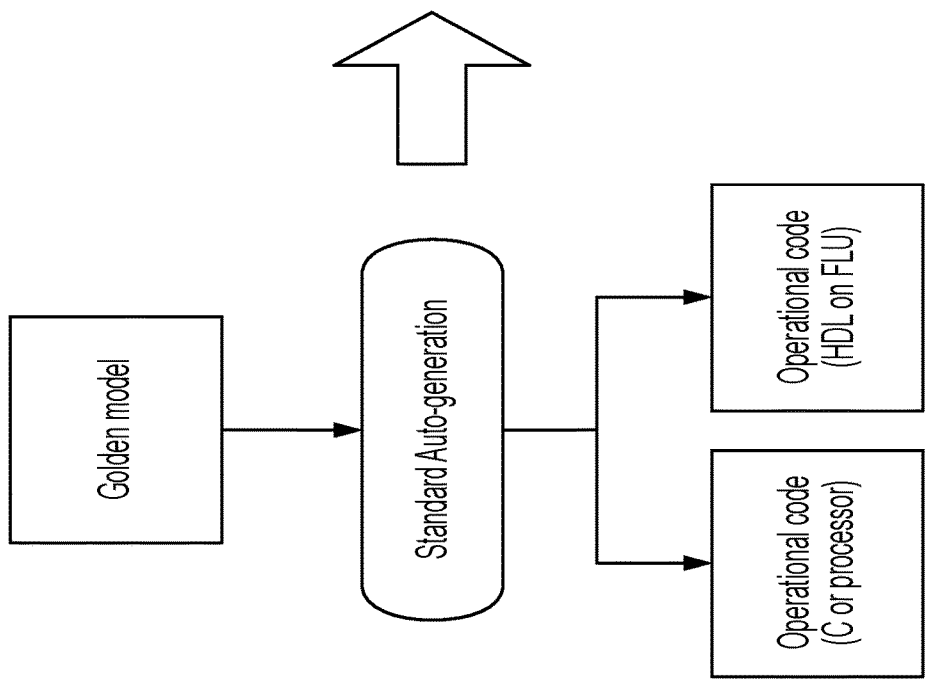
Figure 2:
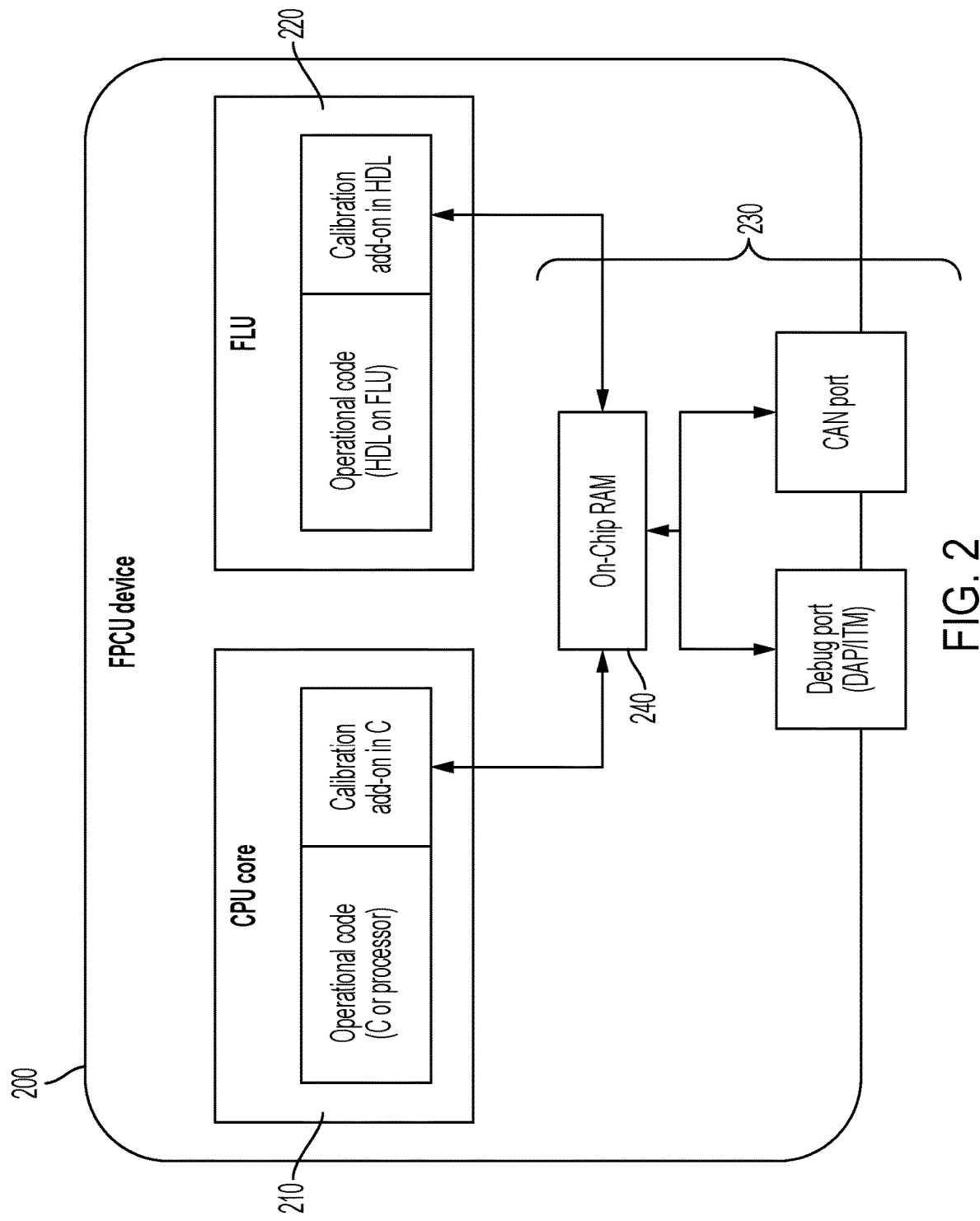
FIG. 2 described the FPCU device for which the disclosure has particular advantages.

The disclosure relates to (i) methods related to code handling such as (multi-)code design. (semi-) automatically (multi-)code generation and (multi-)code execution, including debug and/or test and/or calibration or tuning and a variety of uses enabled by said methods and/or designed code, generated code and (ii) made suitable (via adaptations such as specific resources) target hardware systems, in particular heterogeneous hardware systems (and hence requiring multi-code), suitable target (application) systems, including those hardware systems, to support and/or optimally benefit from said methods.

The disclosure in particular relates to the above wherein for one or more parts of said target (application) systems code descriptions are available and said (multi-) code design methods initially start from said one or more code descriptions, moreover said (multi-)code design method is adapted that its input must be suitable for the subsequent (semi-) automatically (multi-)code generation, which in itself is adapted for generating the variety of codes (denoted above multi-code) for the target hardware system. Further the debug and/or test and/or calibration or tuning capabilities provided by the invented design and/or generation and/or execution and/or simulation environment (or framework) provided by the invention are adapted to sufficiently protect the original (multi-)code), being code before any instructions, code or the like, related to debug and/or test and/or calibration or tuning is added.

The disclosed particularly designed methods enable deployment of a variety of (semi-) automatable uses such as tuning or calibration and/or compare with references (high level abstractions). Moreover those methods also ensure that the hardware systems their hardware limitations can be taken into account (say at their limit as the designer is invited to explore how much extra code can be afforded) while designing for optimal performance in combination with safe execution (by avoiding manual code manipulation and/or providing more than sufficient test/debug and calibration opportunities) for and required by the target (application) system.

The disclosure hence provides designs methods for designing code, starting from and loading of initial code, including one or more system code descriptions, loading debug, test or calibration instructions, further (semi-)automatically generation of further code, suitable for programming of or execution on the target hardware systems, more in particular a heterogeneous hardware system, hence a plurality of further codes are generated, said generating methods, starting from and loading said designed code and loading instructions on which debug, test or calibration instructions to be used. Said generating methods can be integrated directly in said design methods. While said hardware system and/or application system may be connected to debug, test or calibration equipment to provide the related function, the generating methods and/or integrated design method may also include generating of code suitable for steering such equipment.

Given the availability of the various codes described above, the invention provides for debug, test or calibration methods, based on executing of one or more of said generated codes, either on said target hardware system, connected debug, test or calibration equipment or any other computing supporting system used therefore. Moreover automated tuning or calibration and/or compare with references (high level abstractions) can be provided by embedding those executions within a user defined loop.

As described more in more general terms above the disclosure relates to a variety of code handling methods, hence in itself being realized through computer readable code, executable on a computer arrangement, together said code and related computer arrangement forming an environment or framework or infrastructure.

As said the disclosure in particular relates to the above wherein for one or more parts of said target (application) systems code descriptions are available, also called a model, and hence said methods can be called model-based. A typical target application are electric engines as found in pure electric or hybrid vehicle electrical motors and hence the (digital) control thereof. Exemplary embodiments of said model(s) related hence to the motor, the power train. It is worth noting here that the initial code is a high-level (simulation) code, such as but not limited to Matlab or Simulink code or the like).

The disclosure in particular relates to methods for engine control unit hardware, in particular those based on heterogeneous hardware systems (and hence requiring multi-code), more especially FPCU systems comprising at least one or more microprocessor cores and one or more programmable logic matrixes, hence said multi-code comprising operational code for said cores and hardware description language code for said programmable matrixes. Moreover said hardware system preferably includes peripherals (circuits) dedicated to automotive power train control and a custom interconnect structure for control of those from the programmable logic. It is worth noting at this stage that the target application domain imposed fast real-time operations being taken care of in the engine control unit hardware, more especially by the programmable matrix.

The disclosure in particular applies in the specific context where the selected ECU microcontroller device is actually a FPCU (Field Programmable Control Unit).

In a particular embodiment the FPCU is a device that embedded on the same silicon following elements:
One or more standard microprocessor cores
Some standard debug and trace hardware infrastructure
Some generic microcontroller modules (OMA, watchdog, timer, . . . )
A sub-system that contains:
An embedded programmable logic matrix (FLU)
A set of peripherals dedicated to automotive powertrain control (PWM, capture, ADC, CAN, . . . )
A custom interconnect structure that permits direct control of those peripherals from any logic mapped into the FLU.
A DPRAM that permits data transfer from/to FLU As mentioned the disclosure supports debug and/or test and/or calibration or tuning capabilities. This technical problem caused by introducing such support are now described in relation to calibration but similar considerations can be made for debug and/or test capabilities. In essence calibration requires extra code to be added to the design code and likewise in the further (semi-)automatically generated codes and hence the configured matrix and the running code is at least in principle different from the intended code, which might influence the operation, especially in view of the hardware limitations in combination with the fast real-time operations required. Hence a requirement to sufficiently protect the original (multi-)code (also therefore called the golden model), being code before any instructions, code or the like, related to the calibration or tuning exist.

The disclosure hence provides designs methods for designing code, starting from and loading of initial code, including one or more system code descriptions, loading (debug, test or) calibration instructions (specifying those variables in the code descriptions to be considered as calibration parameters and/or those variable in the code descriptions to be considered as to be monitored values), adding those instructions (to a certain extent) to said initial code (in a particular way (e.g. by a sufficient clear annotation or as meta data) such that the further (semi-)automatically generation of further code, suitable for programming of or execution on the target hardware systems (more in particular a heterogeneous hardware system, hence a plurality of further codes are generated) provides (e.g. because it recognizes the provided annotations), besides the code it would originally generate, extra code related to said calibration. Hence extra operational calibration code for said cores (e.g. C code) and calibration hardware description language code for said programmable matrixes is generated.

It can be pointed out at this stage that on hardware level the calibrations require data transfer related thereto, data transfer which is typically more demanding than during ordinary use of the calibrated system. Hence preferably the target heterogeneous hardware systems specific resources (such as internal memory such as on-chip RAM, interconnect permitting data transfer to the core or programmable matrix and input/output ports towards said memory) being sufficient to support those data transfers. It can be emphasized here that the further (semi-)automatically generation of those extra further codes relies or is forced to rely on those provided specific resources.

Further insights in the contribution of the disclosure are now described.

As the calibration task implies that some extra computing functions are added to the initial control algorithm in order to inject calibration value to some pre-defined parameters of the algorithm, and extract the values of some keys variables, such actions are intrusive with regard to the control algorithm.

This is a problem because we add "non-functional" operations in the "golden" model. Therefore generally speaking we cannot consider this model as golden any more. Moreover, while preferably in a design flow without calibration a model-based automated flow is used, adding calibration as manual override over the generated code breaks the model-based automated flow.

As said the disclosure provides designs methods for designing/generating code, starting from and loading of initial code, including one or more system code descriptions, in particular comprising a system model and/or a control model thereof and loading debug, test or calibration instructions (for injection of parameters and/or extraction of variables). The disclosure provides methods for designing/generating code to have calibration features included in operational mode with preferably absolutely no modification of golden model and preferably no manual overrides of generated code.

In the context of a FPCU device, the control algorithm is split between software execution on microprocessor core(s) and hardware execution on FLU.

In both case, the operational code is auto-generated from model.

C code for processor
HDL code for FLU

At model level, the model-based flow allows the designer to easily define which parts of the algorithm are to be executed on processor or on FLU.

The problem is to be able to maintain the same flexibility for adding calibration. This means that these calibration operations can be either in processor or in FLU, but from user model, both should be specified the same way.

This context is illustrated by FIG. 1.

The disclosure further improves designs methods for designing code, starting from and loading of initial code, including one or more system code descriptions, (semi-)automatically generation of further code, suitable for programming of or execution on a heterogeneous hardware system, hence a plurality of further codes are generated, whereby the mapping of said code descriptions on the various parts of the hardware system is defined by the designer in a particular way. Indeed the disclosure provides now design methods, enabling addition of calibration (and the like) instructions, whereby the mapping of the related code thereto on the various parts of the hardware system is defined by the designer in the same way as in the original design method.

Recall that the disclosure method provides a method for automated generating of a plurality codes (40) comprising: (i) loading of initial (high-level simulation) code (10), including one or more code descriptions (golden model), (ii) loading calibration instructions (20) (meta data); (iii) automatically generation (30) of said codes, at least one per available unit (hence (50) for software for the software programmable unit being a microprocessor core and (60) being hardware description language code for said hardware programmable unit being a programmable logic matrix), based on said loaded initial code and said loaded calibration instructions.

The solution developed hence contains the following elements:

A method that defines how specific meta-data can be associated to the golden model. This method describe how the following information can be specified:
The list of model variables or signals that should be considered as calibration parameters (hence candidate to calibration value override)
The list of variables or signals that should be considered as monitored values.

A computer executed software that permits to:
For parameters variables defined in meta-data
Auto-generate the C code that permits to override the value of corresponding software variable if this one corresponds to a CPU core mapped function in golden model.
Auto-generate the HDL code that permits to override the value of corresponding HDL signal if this one corresponds to a FLU mapped function in golden model.

For monitored variables defined in meta-data
Auto-generate the C code that permits to sample the value of corresponding software variable if this one corresponds to a CPU core mapped function in golden model.
Auto-generate the HDL code that permits to sample the value of corresponding HDL signal if this one corresponds to a FLU mapped function in golden model.

The generated codes rely on the FPCU debug or CAN communication ports to transmit/receive calibration data from/to external calibration devices.

In summary the (semi-)automatically generation of (further) codes (50, 60) provides, besides the code it would originally generate (70) (80), extra code related to said calibration, in particular extra operational calibration code for said cores (90) (e.g. C code) and calibration hardware description language code (100) for said programmable matrixes is generated, more especially said codes (90)(100) permit to override and/or to sample the value of a variable (as indicated in the calibration or a like instructions) in the respective original codes (70)(80).

It is worth at this stage to further clarify some elements of the disclosed method. As said codes are generated which include calibration instructions (or the like in the case of tuning, test or debug), more in particular with such calibration instructions is meant the minimal amount of code necessary to provide parameter values and to extract variable values required for a calibration operation, which might further been performed manually but preferably is conducted (to a certain extend) automatically as enabled by the disclosed method. The calibration instructions as automatically generated are those as to be executed on the hardware system its subsystems as described above. This is in contrast with the calibration instructions loaded. Those calibration instructions are provided at the same level of the initial (high-level simulation) code instead, hence called high-level calibration instructions and as only the starting basis for the generation of the extra calibration instructions, also called executable calibration instructions, to be executed on the hardware system. It is also interesting that the loading of those high-level calibration instructions is not necessary a one bulk loading of code, but may include a step of changing (in a particular way) the initial loaded simulation code. The automatically generation of codes, hence, received as input then a modified simulation code. As explained above, the step of automatically generating, which is performed by a combination of a software compiler and a programmable unit mapping tool, has to be adapted to recognized those calibration instructions and act accordingly.

The disclosure can hence formally be defined as a method for automated generating of a plurality codes, suited for execution on a heterogeneous hardware system (200), comprising at least one software programmable unit (210) and at least one hardware programmable unit (220), said codes include executable calibration instructions, said method comprising: (i) loading of initial (high-level simulation) code (10), including one or more code descriptions, (ii) providing or loading high-level calibration instructions (20); (iii) automatically generation (30) of said codes (40), at least one per available unit, based on (i) said loaded initial code and said provided or loaded calibration instructions or (ii) said initial code as modified by said provided calibration instructions, whereby said automatically generation step is adapted for generating extra (execution) code related to said calibration based on said provided or loaded (high-level) calibration instructions.

Figure 3:
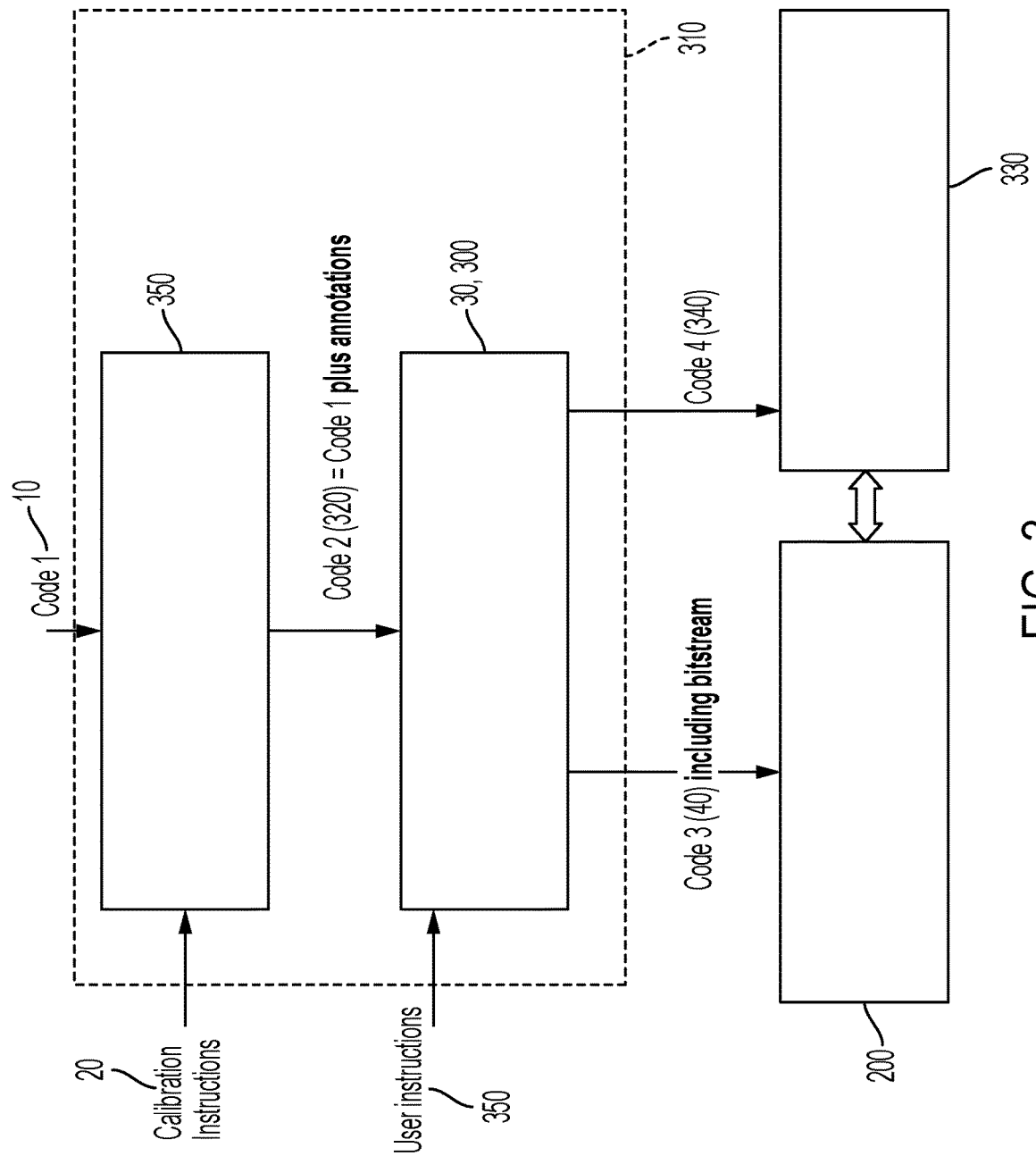
FIG. 3 schematically described the high-level steps of the disclosed methods, the input and outputs (codes) and related elements such as the software environment and different hardware involved.

The disclosure provides for a design and/or calibration (debug, test) framework, more in particular a software environment, compiled for operating on one or more computers, for supporting or facilitating the methods described above and hence also relates to computer program products A (and related non-transitory machine-readable storage media) comprising computer-readable code, that when run on a computer system causes the computer system to execute those As shown in FIG. 3, the disclosure hence provides a software environment (300) for automated generating of a plurality codes, suited for execution on a heterogeneous hardware system (200), comprising at least one software programmable unit (210) and at least one hardware programmable unit (220), said codes include calibration instructions, said method comprising:
(i) loading initial codes (320), modified by or with calibration instructions (by use of annotations or meta data) and (ii) automatically generation (30) of said codes (40), at least one per available unit, based on the loaded codes.

The disclosure further provides a software environment (310) for automated generating of a plurality codes, suited for execution on a heterogeneous hardware system (200), comprising at least one software programmable unit (210) and at least one hardware programmable unit (220), said codes include calibration instructions, said method comprising: (i) loading of initial (high-level simulation) code (10), including one or more code descriptions. (ii) loading calibration instructions (20); (iii) automatically generation (310) of said codes (40), at least one per available unit, based on said loaded initial code and said loaded calibration instructions, be it with an intermediate steps of modifying and/or annotating and automatically generation thereafter.

As said in an embodiment of the disclosure calibration equipment (330) is also provided and the methods and related software environment also automatically generating of code (340), suited for steering calibration equipment to be connected to said heterogeneous hardware system.

The disclosure therefore provides a variety of arrangements, in particular a first arrangement with a computer systems configured with the design or calibration framework, a second arrangement including said first arrangement and the heterogeneous hardware system, for which it generates code, a third arrangement including said first and/or second arrangement, further including said calibration equipment and a fourth arrangement, comprising the so to speak device under test (e.g. an electric engine; and an engine control unit hardware, providing (real-time) control for said engine of which the heterogeneous hardware system is part), the portions of these arrangement performing their functions as discussed before but firmly interconnected via the codes they share and the data streams (instructions, outcomes) they generate and in particular the fact that the particularities of the portions (heterogeneous, real-time constraints) are taken in account where needed while hiding that for the user via the automatic approach.

At this point we can point out also a further functionality of the disclosure. Indeed (while being a high performance device for sure), the hardware (200) has limitations on the amount of code it can execute and as during calibration extra (automatically generated) code needs to be loaded on and executed by it, the user or designer might be inclined or forced to take this into account, which might even lead to a bad outcome. Preferably a user or designer or tester should be able to design his or her debug, test or calibration approach, without having to worry (too much) about this problem or at least have a possibility to separate this concern from his approach development. The disclosure enables this as by providing the calibration instructions (e.g. in the full fledge way he or she likes to perform his strategy or approach) in a way recognizable by the automatic generator or compiler, the user may in a preferred embodiment also provide instructions (350), indicating which ones to use at a certain stage (and hence a subset is generated fitting within the hardware). The user or designer can now execute this strategy in a step by step manner without any code rewriting effort. In a preferred embodiment the software environment even indicates the degree of fit, and hence guides the user or designer in creating his step by step use of this strategy.

Figure 4:
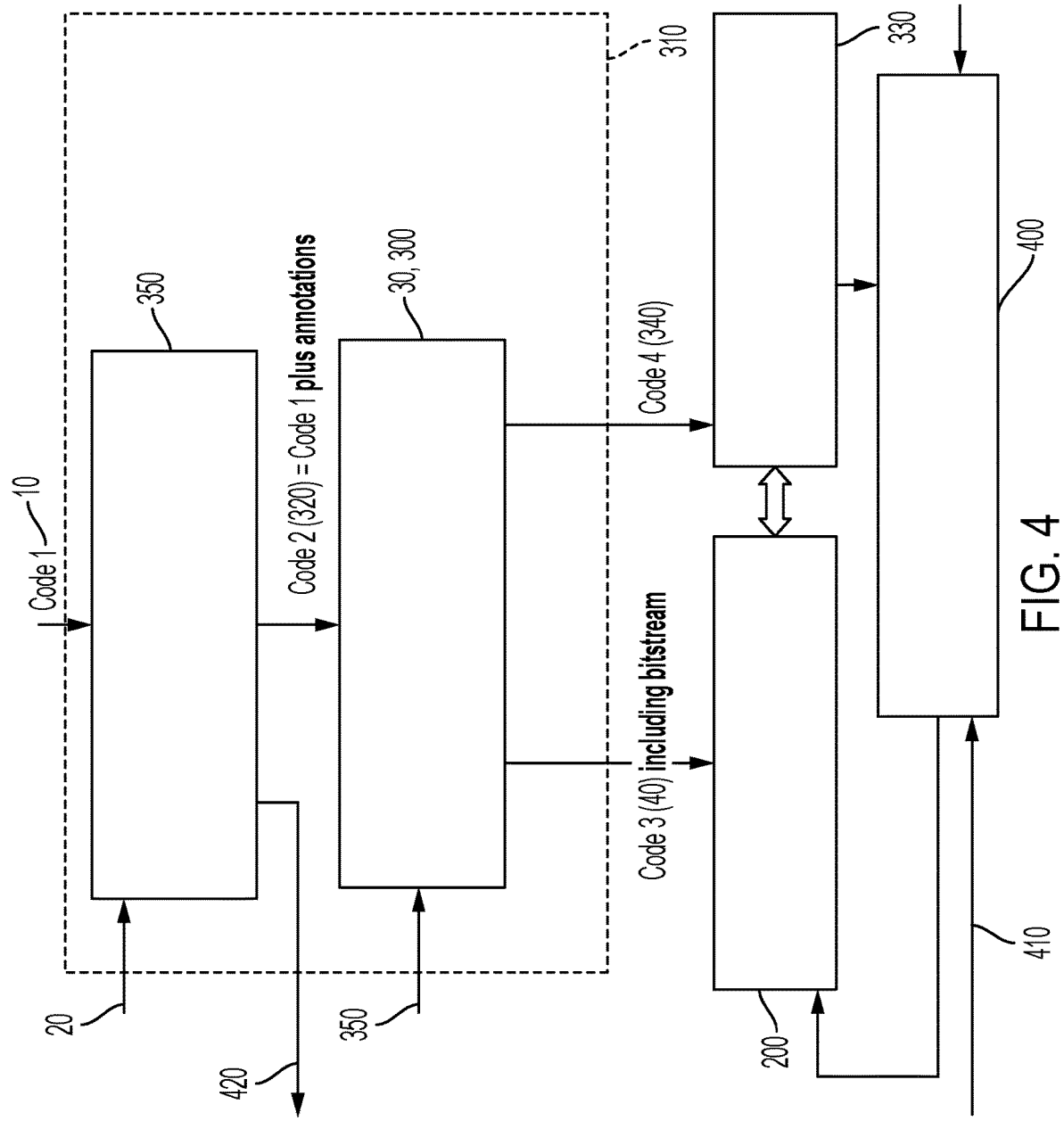
FIG. 4 then schematically described the high-level steps of further uses of the disclosure.
Figure 5:
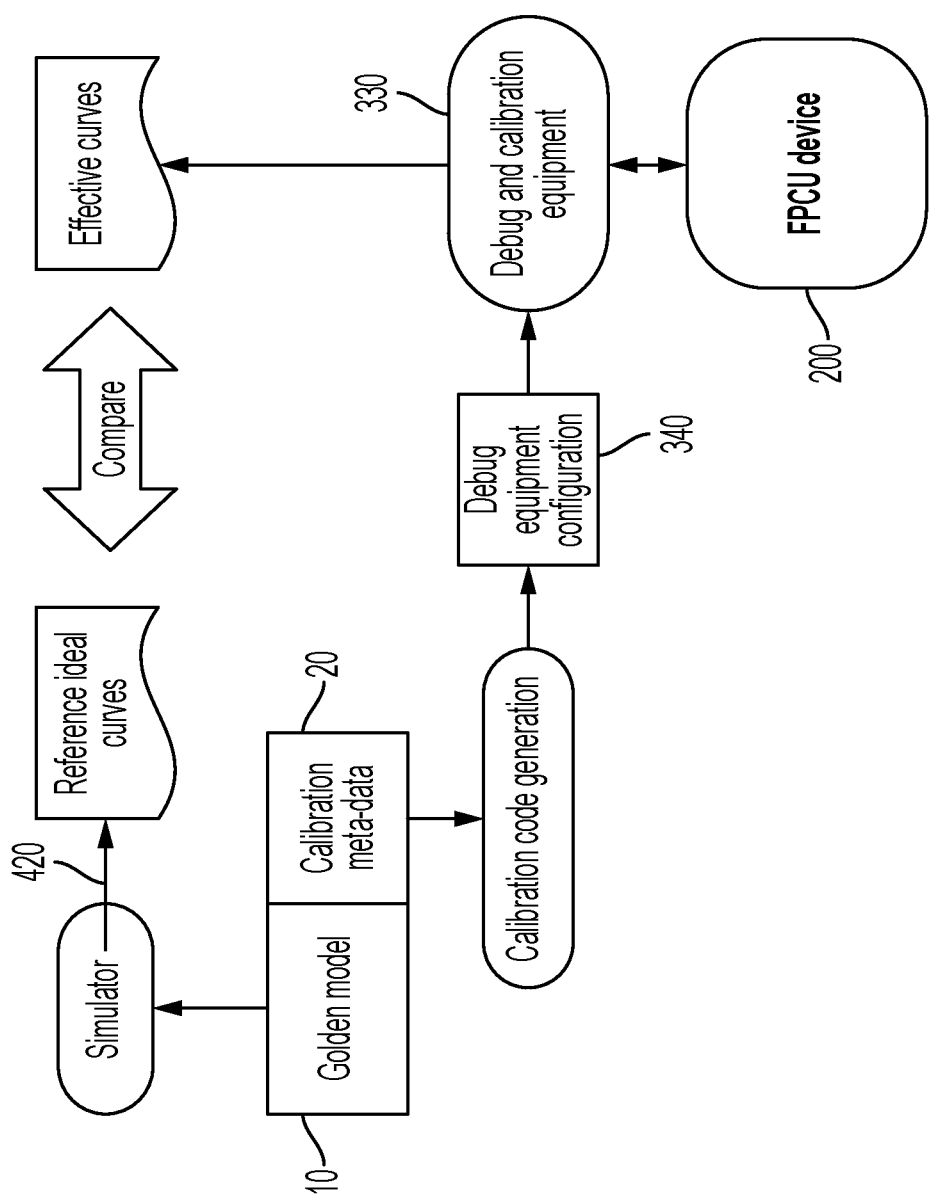
FIG. 5 shows an exemplary embodiment of the disclosure.

Yet another functionality enabled by the disclosure as illustrated in FIG. 4 (and a further exemplary embodiment there is shown in FIG. 5) is that it support now the possibility to perform an auto calibration feedback loop, starting from receiving data from the calibration equipment and/or from other measurements on the device under test and changing the calibration parameters fed to the hardware system. The software environment has means (400) for receiving data, preparing parameters in accordance with the received data and further in accordance with user instructions (410) on how he or she prefer the auto calibration loop to be executed (e.g. parameter range and the discretisation step). The user does not have to coordinate anymore the operations of the hardware, the calibration equipment nor adapt codes nor parameters in it. This is all automatically supported by the environment.

Recall that the initial code (10) is not content wise changed in the software, such that it can also be simulated and thereby generate simulation data (420). This enables a method for controlling the functional similarity of codes, comprising: (i) executing (simulating) initial (high-level simulation) code, including one or more code descriptions, (ii) executing the code as generated from said initial (high-level simulation) code by the methods; and (iii) compare the outcomes of said executions to verify the (substantially) functional similarity of said codes and preferably use this comparison to steer the auto calibration loop as described before.

Alternatively phrasing the above described functionalities of the invention is to emphasize that calibration infrastructure is able to extract some curves of the evolution of internal algorithm variables over time. Thanks to the auto-generated calibration infrastructure, the raw data is stores in FPCU on-chip RAM and can be read-out by state of the art equipment through either debug or CAN port. Once this raw data is read out, the problem is to be able to isolate the block of data corresponding to each and any of the variables monitored by calibration infrastructure. Thanks to the "meta-data" based flow and associated auto-generation program, it is possible to auto-generate the configuration scripts that would allow the debug equipment to extract the data curve and compare them to their ideal values in the golden model.

Figure 6:
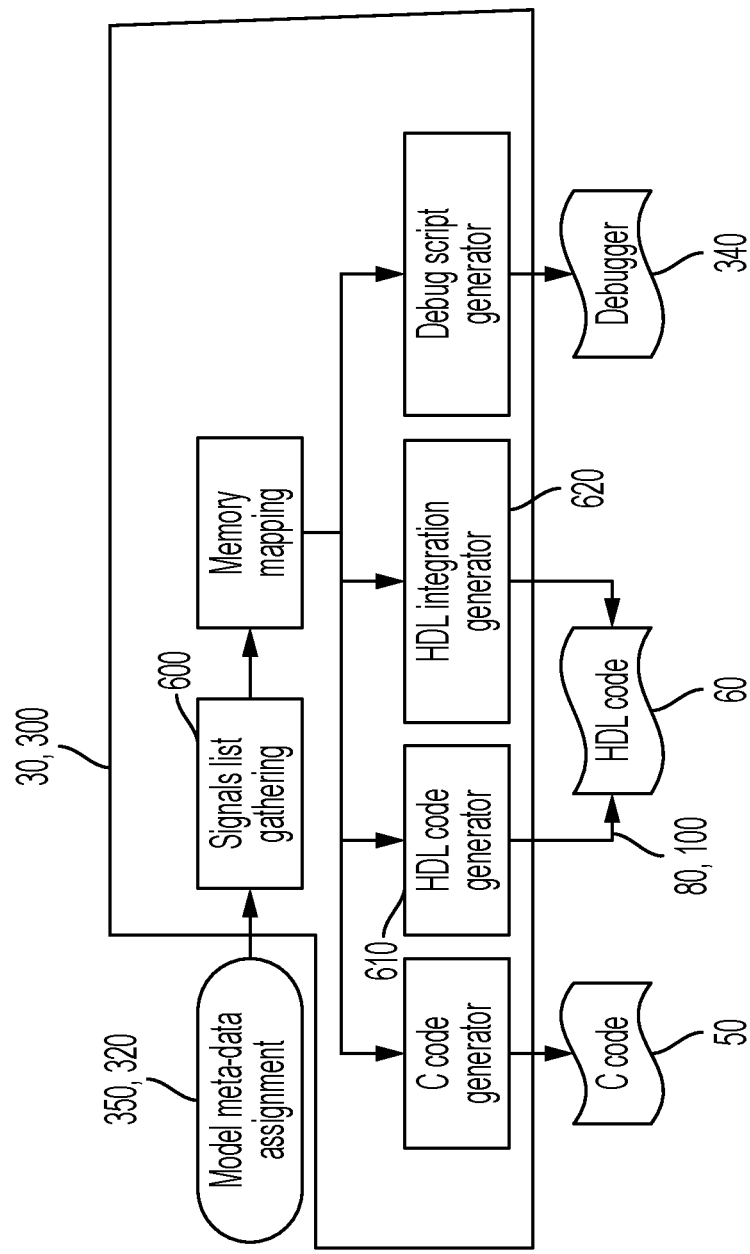
FIG. 6 shows the further detailed list of (ordered) list of steps of a particular realization of the disclosure.

FIG. 6 provides the overview of the processing flow from user input (the user annotated model 320 by step (350)) to generated material (50), (60), (80). (100), (340). Each part of the flow is detailed below.

Figure 7:
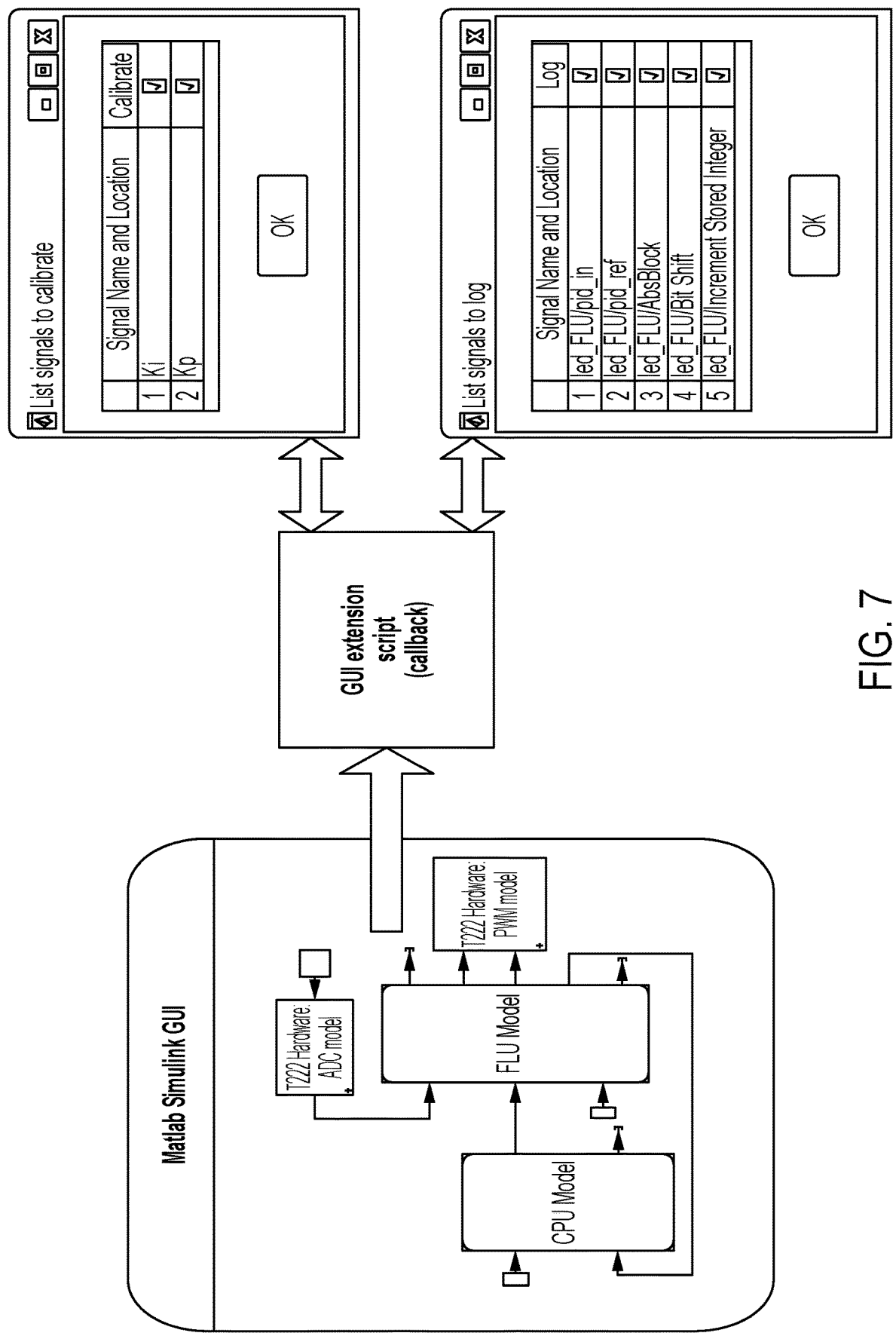
FIG. 7 illustrates an exemplary interface to be used in the disclosure.

In an embodiment of the disclosure the model meta data assignment part of the flow relies on specific Matlab GUI extensions. Those extensions can be executed from (a Matlab) user interface based on contextual menu available on connection signals between processing operators boxes of the simulation model developed by the final user. An exemplary embodiment is shown in FIG. 7.

Those extensions have as roles:
Create and control dedicated dialog windows that permits to specify whether or not certain wires should be considered as candidate for calibration or debug.
Enable the user to associate an identification name to each of the calibrated/debugged signals.

Store those informations as extension to the Model database

The signals list gathering step is a full automatic program. This process prepares a list of calibration and debug signals for the following parts of the flow.

This process can be summarized as:
1. Extract input meta-data from previous step in model data-base. In an exemplary embodiment of the invention this process relies on Matlab scripting API that gives hooks to access those informations.
2. For each 'tagged' signal:
    a. Get the signal name and model hierarchy (e.g. from Matlab API)
    b. Get the signal data-type (e.g. from Matlab API)
    c. Compute necessary data storage size associated to this data type
3. Store signal list and memory size requirements in intermediate data-base for next step of the flow. Note that this may give indications for the calibration strategy step by step approach as described before.

The C code generator is a full automatic program. This process automatically generates the embedded software C code that should be compiled and linked with user defined application software to include debug and trace capabilities. The generated code is a simple header file providing the signals memory mapping information.

The HDL code generator is a full automatic program, generating a HDL module able to properly execute calibration/debug data transfer from/to on-chip memory. This generated module shall be further connected to the "golden" HDL generated from Matlab model. This connection is done in next phase of the processing flow (HDL integration generator).

Figure 8:
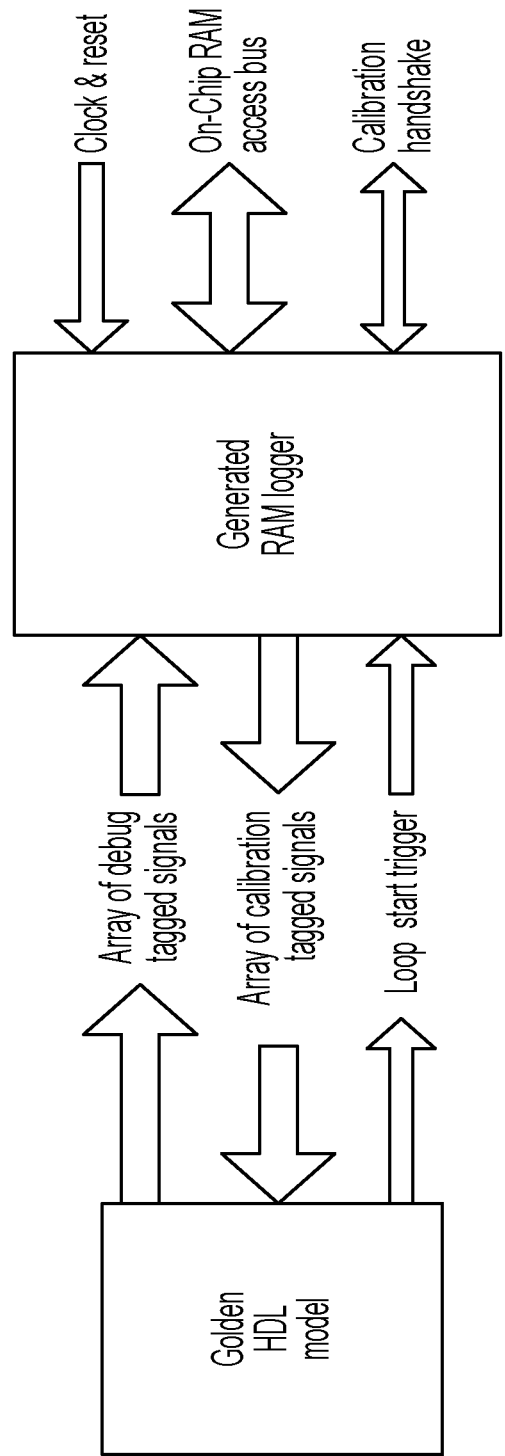
FIG. 8 shows (right side in particular) a particular hardware structure, generated during the use of the disclosure.
Figure 9:
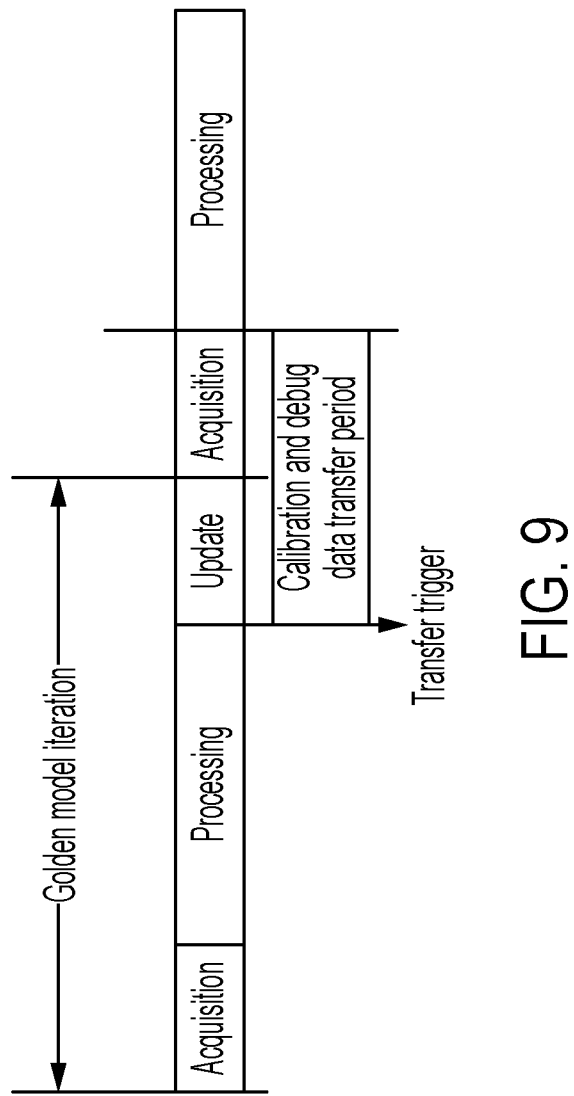
FIG. 9 provides a time diagram, illustrating the technical considerations to be made and implemented by the disclosure in relation to the data transfers caused by the calibration.

This module is generated with input/output ports as shown in FIG. 8.
Array of debug tagged signals:
From debug signal list prepared in previous step of the flow, the generator creates an input port for each signal with the appropriate bit-width.
Array of calibration tagged signals:
From calibration signal list prepared in previous step of the flow, the generator creates an output port for each signal with the appropriate bit-width.
Loop start trigger
This signal is extracted from golden model. It is asserted at each iteration of the golden model algorithm.
On-Chip RAM access bus
This is a data transfer interface between embedded FPGA and system RAM
Calibration handshake
This is a request/acknowledge protocol between calibration infrastructure to enable proper synchronization of the calibration data update with regard to the golden model algorithm iteration loop.
The main challenges solved by the generated module are:
Perform data transfers from/to on-chip RAM as fast as possible.
Perform data-transfer in sync with golden model iteration to avoid conflict FIG. 9 shows a typical behavior of real time control loop algorithm mapped in embedded FPGA. It is basically made of three phases:
1. Acquisition: The embedded FPGA gather multiple inputs from external system sensors modules (ex: ADC).
2. Processing: The FPGA computes those inputs and calculates output data values
3. Update: the computed output data is transferred through power-train actuator through digital module (i.e. PWM)

This behavior puts the following challenging constraints on our calibration and debug infrastructure:
1. The processing phase is using the calibration data as parameter for the algorithm. Therefore, it is not possible to safely change the calibration parameters during this phase.
2. The processing phase is calculating debug data. So it cannot be guaranteed that those values are valid until end of processing.

Conclusion: the challenge solve is to have a mechanism that restrict the debug and calibration data transfer to acquisition and update periods.

Figure 10:
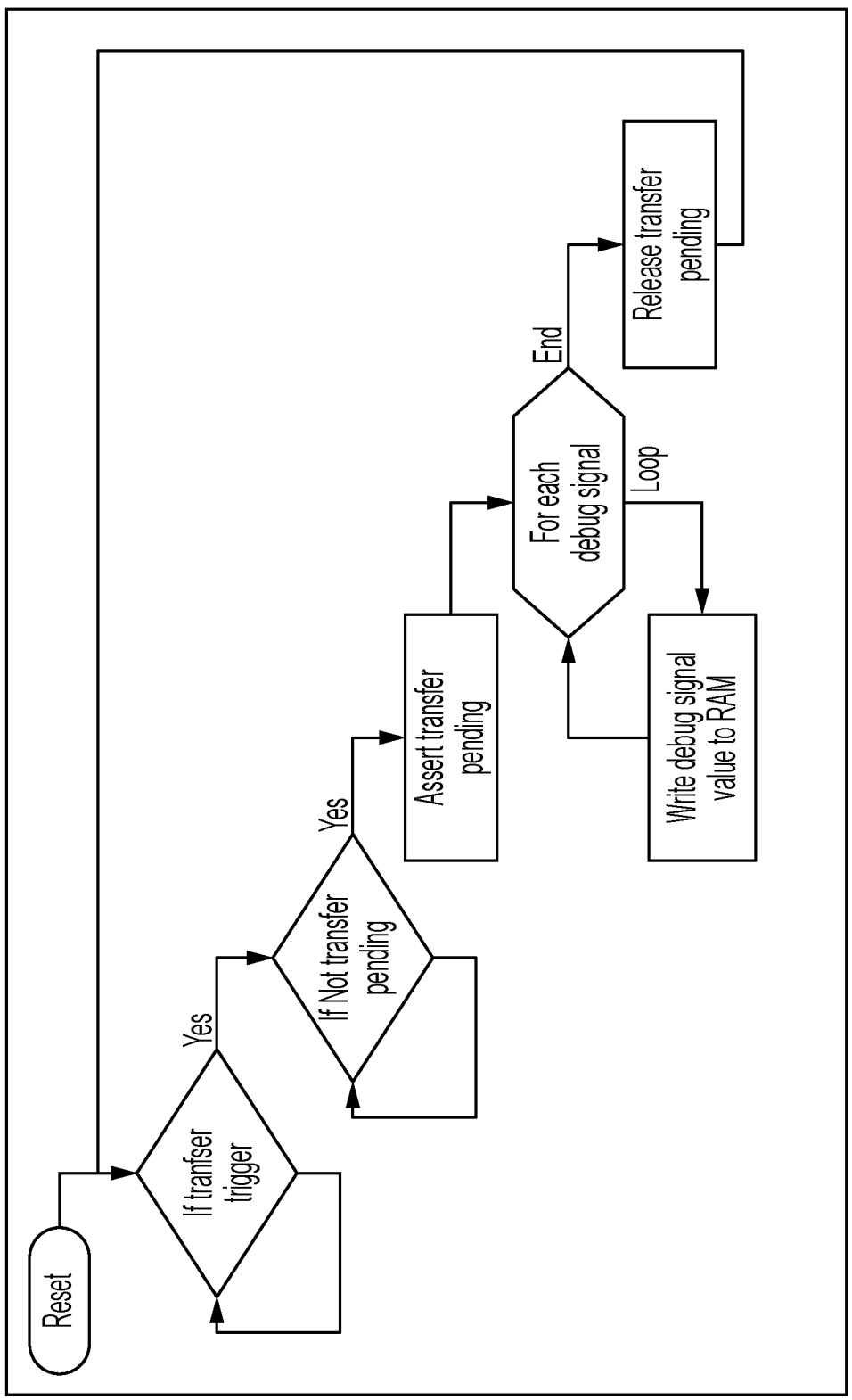
FIGS. 10 and 11 illustrate certain detail flowchart used in exemplary implementations of the disclosure.
Figure 11:
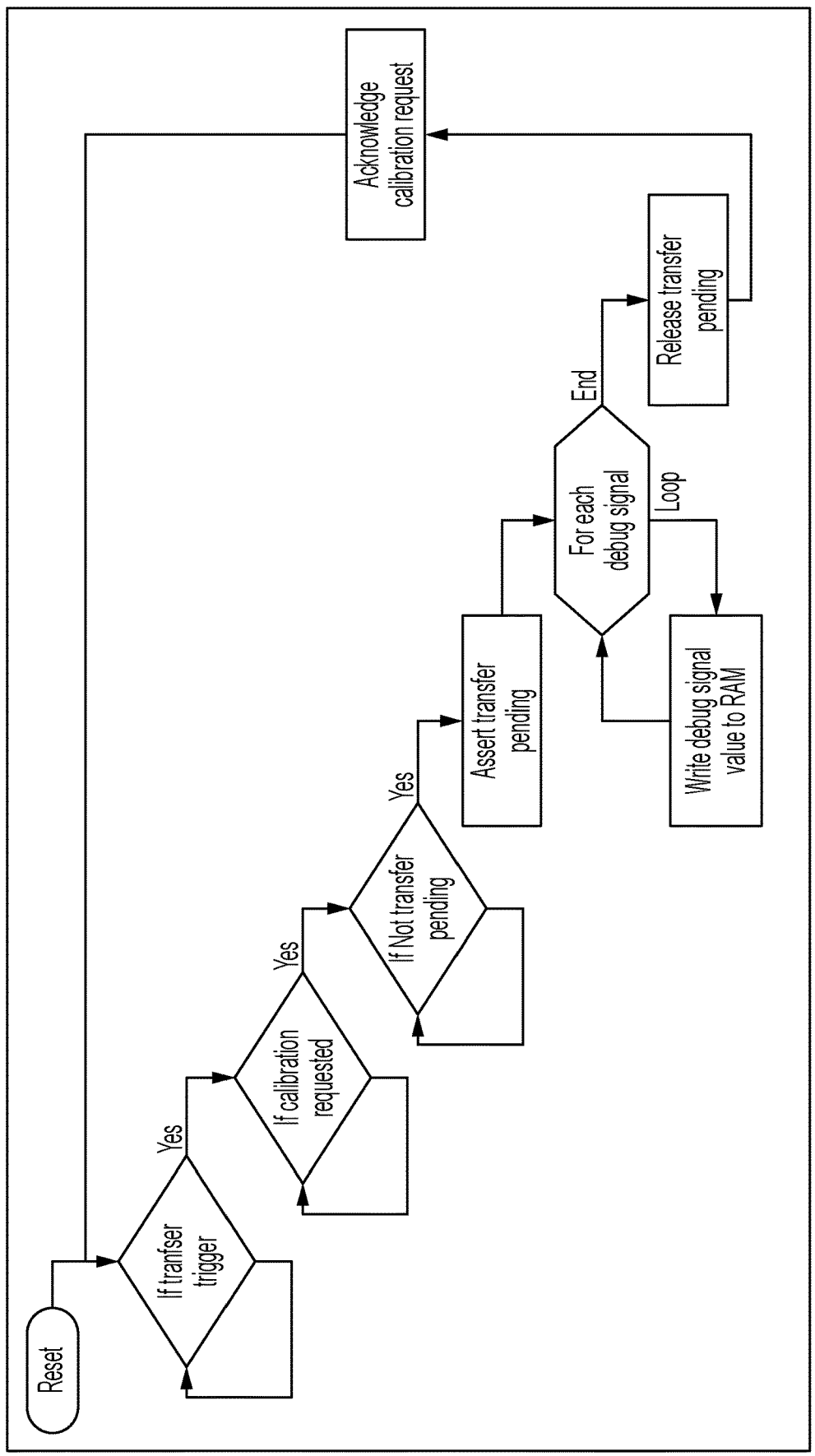

The debug data transfer process in generated HDL module as shown in FIG. 10 is dedicated to transferring the value of previously identified debug signals to on-chip RAM. The calibration data transfer process in generated HDL module as shown in FIG. 11 is dedicated to transferring the value of previously identified calibration signals to on-chip RAM.

The HDL integration generator is a full automatic program.

It consists on automatically generating an HDL wrapper that instantiate both:
Golden HDL model generated from Matlab model (using standard Matlab HDL generator)
Previously generated RAM logger module And then create wire connections between both.

The debugger script generator is an automatic program that takes as input the list of debug signal and associated memory mapping computed from first phases of the flow.

Based on this information it generates a set of scripts in the language of the target debugger system. The objective of those scripts enables the debugger to properly extract the chunks of data corresponding to each debug signal from the raw bit stream flowing out of the device.

In summary the code generating steps comprises of a plurality of sub steps, starting with an automated signals list gathering step from its input code (model data-base), resulting in a list of calibration and debug signals, suitable for the following parts of the flow. Another step is automatic C code generator, providing the software C code that should be compiled and linked with user defined application software to include debug and trace capabilities. The generated code provides the signals memory mapping information. Yet another step is the automatic HDL code generator, generating a HDL module able to properly execute calibration/debug data transfer from/to on-chip memory. This generated module shall be further connected to the "golden" HDL generated from the model, by the next sub step being the HDL integration generator, providing a HDL module for performing data transfer from and to (on-chip) memory (RAM) in sync with golden model iteration to avoid conflict by supporting a mechanism that restrict the debug and calibration data transfer to identified acquisition and update periods. Finally an automatic HDL integration generator sub step automatically generating an HDL wrapper that instantiate both Golden HDL model and Previously generated RAM logger module and then create wire connections between both. Further the automatic debugger script generator sub step takes as input the list of debug signal and associated memory mapping computed from first phases of the flow and based on this information it generates a set of scripts in the language of the target debugger system.

Figure 12:
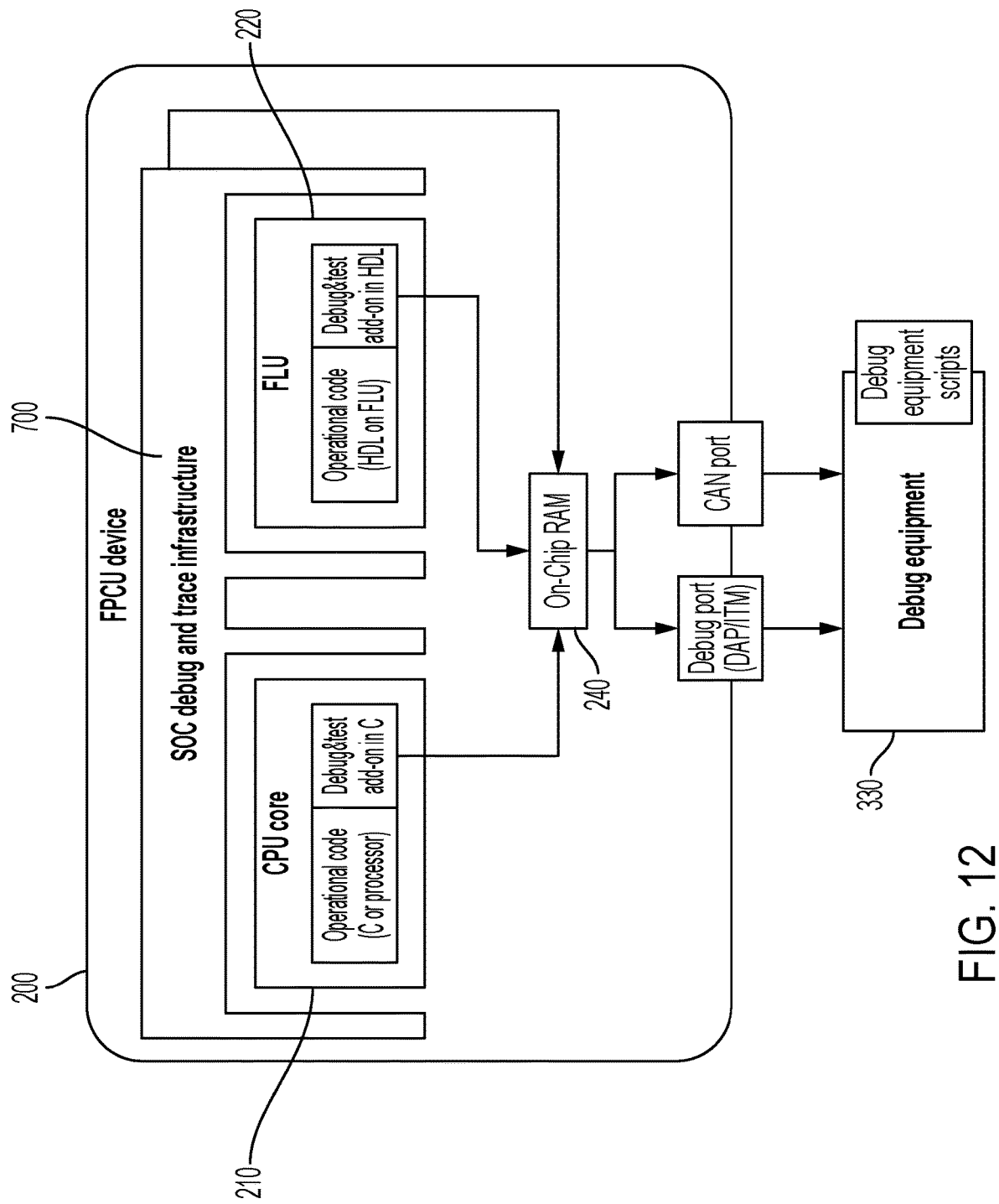
FIG. 12 described a variant of FPCU device of FIG. 2 with debug infrastructure for which the disclosure has particular additional advantageous features.
Figure 13:
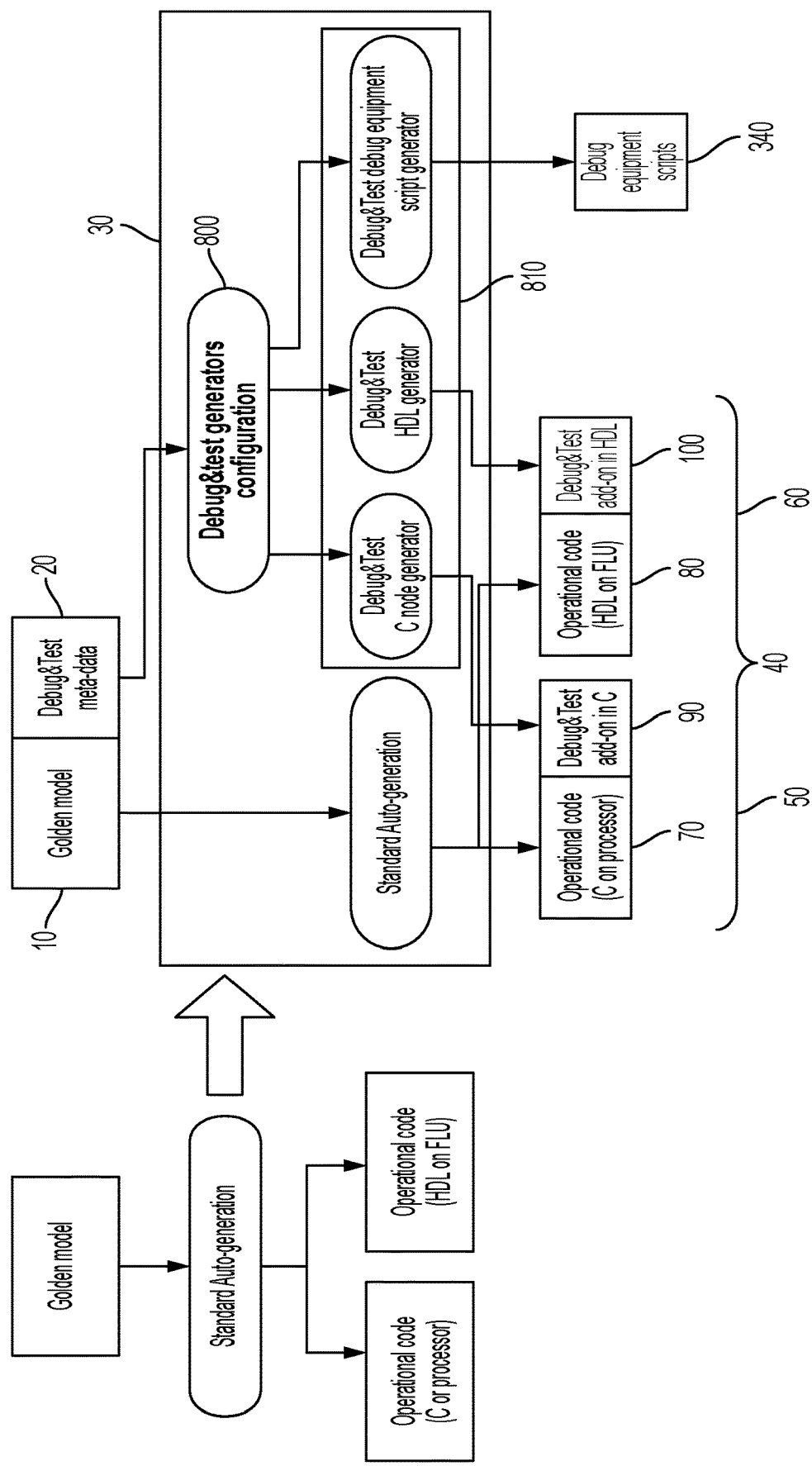
FIG. 13 described a variant of context of the disclosure (left side), in particular for the FPCU of FIG. 12 and the calibration challenge its supports.

Finally it is worth emphasizing the particular context of FIG. 12 and FIG. 13, wherein the FPCU has debug infrastructure (700), generally know as debug and trace infrastructure. Indeed such infrastructure can be available and is responsible from: (1) Gathering all the debug and trace data all over the circuit thanks to various intrusive elements:
Probing of the instructions executed by the CPU
Probing of the data transfers on systems busses
Probing of many events in the FPCU (IRQ, OMA requests, triggers, . . . )
Probing of all the input and output transaction around FLU
(2) Timestamp of all those data
(3) Packing and encoding of those data
(4) Storing of those data in on-chip trace memory
(5) Transfer to the external debug equipment through appropriate interface.

It is a particular contribution of the invention to provide additional features to the previously described methods for the case wherein the FPCU has debug infrastructure (700) to thereby support more complex debug and test scenarios not envisioned in the state of the art.

The invention hence provides a method for automated generating of a plurality codes, suited for execution on a heterogeneous hardware system (200), comprising at least one software programmable unit (210) and at least one hardware programmable unit (220) and debug and test infrastructure (700), said codes include executable debug and/or test instructions, said method comprising: (i) loading of initial code (10), including one or more code descriptions, (ii) providing user debug and/or test instructions (20), specifying those variables in the code descriptions to be considered as calibration parameters and/or those variables in the code descriptions to be considered as to be monitored values, on said initial code (10); (iii) a step of automatically generating (30) of said codes (40), at least one per available unit, based on said loaded initial code, provided with debug and/or test instructions, characterized in that an intermediate step (800) is foreseen, in particular a step (iii) of automatically generating (30) of said codes (40), at least one per available unit, based on said loaded initial code, provided with debug and/or test instructions, comprises a step (a) of automated determining (800) whether the to be generated codes respectively for the software programmable unit (210) and the hardware programmable unit (220) will be provided with said debug- and/or test instructions or whether said debug and test infrastructure (700) will perform (part of) those and thereafter a step (b) of automatically generating (810) of said codes (40), at least one per available unit, based on said loaded initial code, provided with debug and/or test instructions, based on said automatic determining of step (a).

Figure 14:
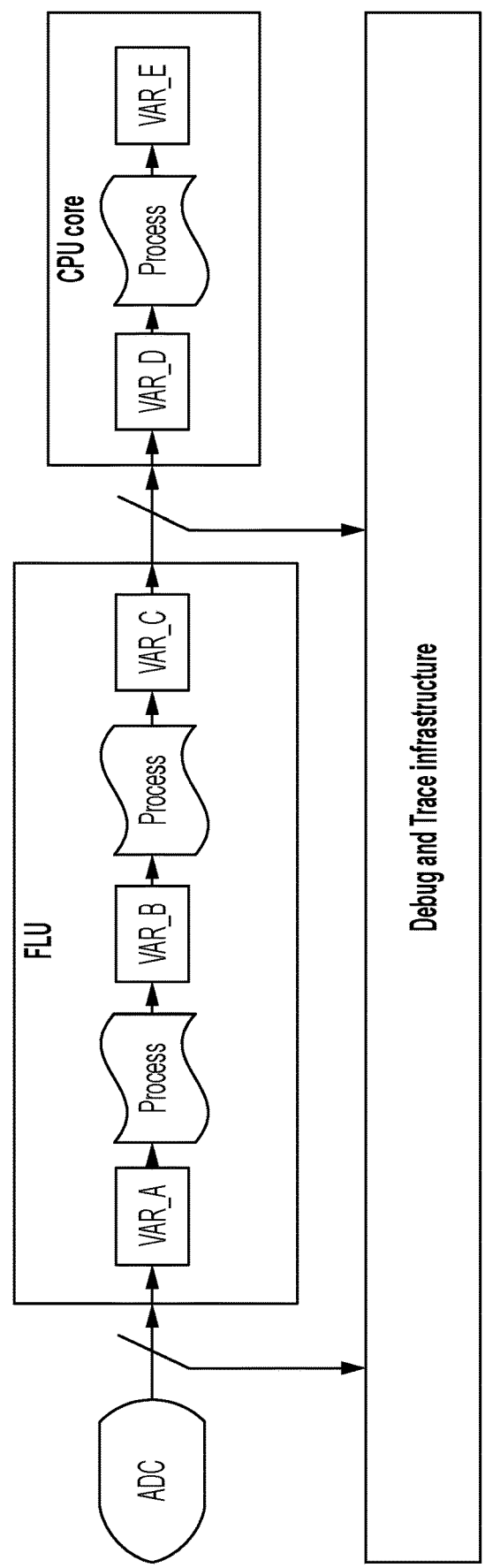
FIG. 14 provides an illustrative example for the context of FIGS. 12 and 13.

A simple example (as shown in FIG. 14) is now described:
Let's take a simple example of model where an analog data is sampled through ADC peripheral, pre-processed by the FLU and converted to another data that is sent to the FLU
We can also imagine some intermediate variable in FLU and CPU processing
In this example, we have 5 variables that are candidate for debug probing.
VAR_A: inside FLU and visible by debug infrastructure (FLU interface probing)
VAR_B: only accessible by FLU interface logic
VAR_C: accessible by FLU and debug infrastructure
VAR_D: accessible by debug infrastructure and CPU
VAR_E: only accessible by CPU software
So, the role of the code generation configurator (800) is to decide which of the three components is the most appropriate to manage a variable for debug & test. This software is able to analyse the golden model to understand which of the three elements has visibility on a given variable. Based on this, the software will allocate the variable management to the appropriate code generator.

In an exemplary embodiment the decision will be:
If a variable is visible from debug infrastructure, then it will be handled through debug equipment script because this is the less intrusive management
Else, is a variable is visible by both CPU and FLU, the choice will usually be CPU to limit the impact of hard real processing.
Other priorities management may be defined based on other constraints
Example: if the CPU software is already 100% loaded by golden model function, then the algorithm may decide to manage the variable in FLU.

The invention claimed is:

1. A method for automated generating of a plurality of codes, for execution on an engine control unit hardware, providing control for an electrical engine, said engine control unit hardware being a heterogeneous digital control hardware system, comprising at least one software programmable unit and at least one hardware programmable unit, said codes including executable debug and/or test instructions, said method comprising:
(i) loading of initial code, including one or more code descriptions;
(ii) providing user debug and/or test instructions, specifying those variables in the code descriptions to be considered as calibration parameters and/or those variables in the code descriptions to be considered as monitored values, on said initial code;
(iii) a step of automatically generating of said plurality of codes, at least one per available unit, based on said loaded initial code, provided with said user debug and/or test instructions,
wherein said software programmable unit is a microprocessor core and its corresponding code is software language code and said hardware programmable unit is a programmable logic matrix and its corresponding code is hardware description language (HDL) code;
wherein said software language code and said HDL code provide, besides respective original design codes they would originally generate, extra codes, which permit to override and/or to sample the value of a variable in the respective original designed codes;
wherein (iii) includes automated gathering of a list of signals from said loaded initial code, provided with user debug and/or test instructions, resulting in a list of calibration signals; and
wherein the software language code provides memory mapping information of the calibration signals.

2. The method of claim 1, wherein said user does not have to provide whether the to be generated extra codes, respectively for the software programmable unit and the hardware programmable unit, will be provided with said debug and/or test instructions or, when provided, whether said debug and test infrastructure will perform a part of those.

3. The method of claim 1, wherein said plurality of codes permit to override and/or to sample the value of a variable as indicated in the user debug and/or test instructions in the initial code.

4. The method of claim 2, wherein (iii) a step of automatically generating of said plurality of codes, at least one per available unit, based on said loaded initial code, provided with debug and/or test instructions, comprises a step (a) of automated determining whether the to be generated codes respectively for the software programmable unit and the hardware programmable unit will be provided with said debug and/or test instructions or when provided said debug and/or testing infrastructure will perform a part of those and thereafter a step (b) of automatically generating of said plurality of codes, at least one per available unit, based on said loaded initial code, provided with debug and/or test instructions, based on said automatic determining of step (a).

5. The method of claim 4, wherein said step (a) is based on determining whether said parameters or variables are accessing by said debug and test infrastructure and/or the code load on the said software programmable unit.

6. The method of claim 1, further comprising (iv) a step of automatically generating of code, suited for calibration and/or debug equipment to be connected to said heterogeneous digital control hardware system.

7. The method of claim 1, wherein said heterogeneous digital control hardware system includes specific resources to support data transfers related to debug and/or test and the automatically generated codes exploit those resources.

8. The method of claim 1, wherein step (iii) includes the step of automated gathering of a list of signals from said loaded initial code, provided with user debug and/or test instructions, resulting in a list of calibration signals.

9. The method of 8, wherein step (iii) includes the step of automatic HDL module code generating for generating a HDL module able to execute calibration data transfer from/to on-chip memory, being part of specific resources by supporting a mechanism that restrict the calibration data transfer to identified acquisition and/or update periods, preferably said automatic HDL module code generating using said list of calibration signals.

10. The method of claim 9, wherein step (iii) includes (a) the step of generating HDL from the initial code and (b) a step of connecting this generated HDL with the generated HDL module to obtain code using said list of calibration signals.

11. A method for controlling functional similarity codes automatically generated as a plurality of codes, the method comprising:
(i) executing (simulating) initial (high-level simulation) code, including one or more code descriptions, on an engine control unit hardware, providing control for an electrical engine, said engine control unit hardware being a heterogeneous digital control hardware system, comprising at least one software programmable unit and at least one hardware programmable unit;
(ii) executing an original designed code as generated from said initial (high-level simulation) code by
(ii-i) loading of initial code, including one or more code descriptions;
(ii-ii) providing user debug and/or test instructions, specifying those variables in the code descriptions to be considered as calibration parameters and/or those variables in the code descriptions to be considered as monitored values, on said initial code;
(ii-iii) a step of automatically generating of said plurality of codes, at least one per available unit, based on said loaded initial code, provided with said user debug and/or test instructions,
wherein said software programmable unit is a microprocessor core and its corresponding code is software language code and said hardware programmable unit is a programmable logic matrix and its corresponding code is hardware description language (HDL) code; and
wherein said software language code and said HDL code provide, besides respective original design codes they would originally generate, extra codes, which permit to override and/or to sample the value of a variable in the respective original designed codes; and
(iii) comparing the outcomes of said executions to verify the substantially functional similarity of the initial code and the original designed code,
wherein (iii) includes automated gathering of a list of signals from said loaded initial code, provided with user debug and/or test instructions, resulting in a list of calibration signals; and
wherein the software language code provides memory mapping information of the calibration signals.

12. A computer program product comprising:
computer-readable code, that when run on a computer system causes the computer system to execute the method according to claim 1; and
a non-transitory machine-readable storage medium storing the computer-readable code.

13. The method of claim 1, said at least one software programmable unit and said at least one hardware programmable unit being on a same silicon.

14. The method of claim 1, said at least one software programmable unit and said at least one hardware programmable unit being on a same silicon.

15. The method of claim 1, wherein said heterogeneous digital control hardware system includes specific resources on a same silicon to support data transfers related to debug and/or test and the automatically generated codes exploit those resources.

16. An arrangement comprising:
an electrical engine; and
an engine control unit hardware, providing control for said electrical engine, said engine control unit hardware comprising a heterogeneous digital control hardware system comprising at least one software programmable unit and at least one hardware programmable unit and said units are adapted for executing a plurality of codes are generated by
(i) loading of initial code, including one or more code descriptions;
(ii) providing user debug and/or test instructions, specifying those variables in the code descriptions to be considered as calibration parameters and/or those variables in the code descriptions to be considered as monitored values, on said initial code;
(iii) a step of automatically generating of said plurality of codes, at least one per available unit, based on said loaded initial code, provided with said user debug and/or test instructions,
wherein said software programmable unit is a microprocessor core and its corresponding code is software language code and said hardware programmable unit is a programmable logic matrix and its corresponding code is hardware description language (HDL) code;
wherein said software language code and said HDL code provide, besides respective original design codes they would originally generate, extra codes, which permit to override and/or to sample the value of a variable in the respective original designed codes;

wherein (iii) includes automated gathering of a list of signals from said loaded initial code, provided with user debug and/or test instructions, resulting in a list of calibration signals; and wherein the software language code provides memory mapping information of the calibration signals.

17. The arrangement of claim 16, wherein said heterogeneous digital control hardware system includes specific resources to support data transfers related to calibration.

18. The arrangement of claim 16, and calibration equipment to be connected to said heterogeneous digital control hardware system and said engine, wherein said calibration equipment is adapted for executing the plurality of code as generated by (iv) a step of automatically generating of code, suited for calibration and/or debug equipment to be connected to said heterogeneous digital control hardware system.

* * * * *